US010269686B1

(12) United States Patent
Yenrudee et al.

(10) Patent No.: US 10,269,686 B1
(45) Date of Patent: Apr. 23, 2019

(54) METHOD OF IMPROVING ADHESION BETWEEN MOLDING COMPOUNDS AND AN APPARATUS THEREOF

(71) Applicant: UTAC Headquarters PTE. LTD., Singapore (SG)

(72) Inventors: Suebphong Yenrudee, Bangkok (TH); Saravuth Sirinorakul, Bangkok (TH)

(73) Assignee: UTAC Headquarters PTE, LTD., Singapore (SG)

( * ) Notice: Subject to any disclaimer, the term of this patent is extended or adjusted under 35 U.S.C. 154(b) by 0 days.

(21) Appl. No.: 15/167,724

(22) Filed: May 27, 2016

Related U.S. Application Data

(60) Provisional application No. 62/167,157, filed on May 27, 2015.

(51) Int. Cl.
*H01L 23/495* (2006.01)
*H01L 23/31* (2006.01)
*H01L 21/56* (2006.01)
*H01L 21/78* (2006.01)
*H01L 21/311* (2006.01)
*H01L 21/48* (2006.01)
*H01L 21/683* (2006.01)

(52) U.S. Cl.
CPC .. *H01L 23/49513* (2013.01); *H01L 21/31111* (2013.01); *H01L 21/4853* (2013.01); *H01L 21/565* (2013.01); *H01L 21/6836* (2013.01); *H01L 21/78* (2013.01); *H01L 23/3135* (2013.01); *H01L 23/4952* (2013.01); *H01L 23/49503* (2013.01); *H01L 23/49575* (2013.01)

(58) Field of Classification Search
None
See application file for complete search history.

(56) References Cited

U.S. PATENT DOCUMENTS

| | | | |
|---|---|---|---|
| 3,611,061 A | 10/1971 | Segerson | |
| 4,411,719 A | 10/1983 | Lindberg | |
| 4,501,960 A | 2/1985 | Jouvet et al. | |
| 4,801,561 A | 1/1989 | Sankhagowit | |
| 4,827,376 A | 5/1989 | Voss | |
| 4,855,672 A | 8/1989 | Shreeve | |
| 5,247,248 A | 9/1993 | Fukunaga | |
| 5,248,075 A | 9/1993 | Young et al. | |

(Continued)

OTHER PUBLICATIONS

Non-Final Office Action dated May 26, 2011, U.S. Appl. No. 12/579,600, filed Oct. 15, 2009, Woraya Benjavasukul et al.

(Continued)

*Primary Examiner* — Tom Thomas
*Assistant Examiner* — Steven B Gauthier
(74) *Attorney, Agent, or Firm* — Haverstock & Owens LLP

(57) ABSTRACT

Embodiments of the present invention relate to a semiconductor package that includes a locking feature. The locking feature is provided by an unnatural surface roughness of a first molding compound to increase adhesion with a second molding compound. Surfaces of first molding compound are roughened by an abrasion process such that the surfaces are rougher than a natural surface roughness. The roughened surfaces of the first molding compound provide better adhesion of the second molding compound to the roughened surfaces than to untreated surfaces (e.g., surfaces with the natural surface roughness).

20 Claims, 4 Drawing Sheets

(56) References Cited

U.S. PATENT DOCUMENTS

| | | |
|---|---|---|
| 5,396,185 A | 3/1995 | Honma et al. |
| 5,397,921 A | 3/1995 | Karnezos |
| 5,455,455 A | 10/1995 | Badehi |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,866,949 A | 2/1999 | Schueller |
| 5,990,692 A | 11/1999 | Jeong et al. |
| 6,072,239 A | 6/2000 | Yoneda et al. |
| 6,111,324 A | 8/2000 | Sheppard et al. |
| 6,136,460 A | 10/2000 | Chen et al. |
| 6,159,770 A | 12/2000 | Tetaka et al. |
| 6,229,200 B1 | 5/2001 | Mclellan et al. |
| 6,242,281 B1 | 6/2001 | Mclellan et al. |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,392,427 B1 | 5/2002 | Yang |
| 6,400,004 B1 | 6/2002 | Fan et al. |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,506,314 B1 | 1/2003 | Whitney, Jr. et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,639,308 B1 | 10/2003 | Crowley et al. |
| 6,660,626 B1 | 12/2003 | Lin |
| 6,667,191 B1 | 12/2003 | McLellan et al. |
| 6,686,667 B2 | 2/2004 | Chen et al. |
| 6,703,696 B2 | 3/2004 | Ikenaga et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,897,428 B2 | 5/2005 | Minamio et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,969,638 B2 | 11/2005 | Estepa et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 2/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,224,048 B1 | 5/2007 | McLellan et al. |
| 7,205,178 B2 | 7/2007 | Shiu et al. |
| 7,247,526 B1 | 7/2007 | Fan et al. |
| 7,274,088 B2 | 9/2007 | Wu et al. |
| 7,314,820 B1 | 1/2008 | Lin et al. |
| 7,315,080 B1 | 1/2008 | Fan et al. |
| 7,320,937 B1 | 1/2008 | Pal et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,451,539 B2 | 11/2008 | Morris et al. |
| 7,482,690 B1 | 1/2009 | Fan et al. |
| 7,595,225 B1 | 9/2009 | Fan et al. |
| 7,714,418 B2 | 5/2010 | Lim et al. |
| 8,084,299 B2 | 12/2011 | Tan |
| 8,623,708 B1 | 1/2014 | Do |
| 8,736,065 B2 | 5/2014 | Gonzalez |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2004/0014257 A1 | 1/2004 | Kim et al. |
| 2004/0046237 A1 | 3/2004 | Abe et al. |
| 2004/0046241 A1 | 3/2004 | Combs et al. |
| 2004/0080025 A1 | 4/2004 | Kasahara et al. |
| 2004/0110319 A1 | 6/2004 | Fukutomi et al. |
| 2004/0209443 A1 | 10/2004 | Cadieux et al. |
| 2005/0003586 A1 | 1/2005 | Shimanuki et al. |
| 2005/0037618 A1 | 2/2005 | Lee et al. |
| 2005/0077613 A1 | 4/2005 | McLellan et al. |
| 2006/0097366 A1* | 5/2006 | Sirinorakul ......... H01L 21/4835 257/666 |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0090497 A1 | 4/2007 | Abbott |
| 2007/0090529 A1 | 4/2007 | McCarthy et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2008/0246132 A1 | 10/2008 | Kasuya et al. |
| 2009/0039530 A1 | 2/2009 | Fryklund |
| 2009/0160041 A1* | 6/2009 | Fan ...................... H01L 21/565 257/680 |
| 2009/0294928 A1 | 12/2009 | Kim et al. |
| 2010/0184256 A1* | 7/2010 | Chino .................. H01L 21/561 438/118 |
| 2010/0207258 A1 | 8/2010 | Eun et al. |
| 2011/0076805 A1* | 3/2011 | Nondhasitthichai ........................ H01L 21/561 438/123 |
| 2011/0115066 A1 | 5/2011 | Kim |
| 2012/0119373 A1* | 5/2012 | Hunt ..................... H01L 21/565 257/774 |
| 2012/0241922 A1 | 9/2012 | Pagaila |
| 2012/0295085 A1 | 11/2012 | Iida et al. |
| 2014/0167232 A1 | 6/2014 | LoBianco et al. |
| 2014/0264839 A1* | 9/2014 | Tsai ................. H01L 23/49816 257/737 |

(56) References Cited

U.S. PATENT DOCUMENTS

| | | | | |
|---|---|---|---|---|
| 2015/0235873 A1* | 8/2015 | Wu | ....................... | H01L 21/565 |
| | | | | 438/107 |
| 2015/0344730 A1* | 12/2015 | Lee | ....................... | C08G 14/06 |
| | | | | 438/127 |
| 2016/0148904 A1 | 5/2016 | Zhai | | |
| 2016/0163566 A1* | 6/2016 | Chen | .................... | H01L 25/105 |
| | | | | 257/774 |

OTHER PUBLICATIONS

Notice of Publication dated Sep. 29, 2011, U.S. Appl. No. 13/156,257, filed Jun. 8, 2011, Woraya Benjavasukul et al.
Final Office Action dated Nov. 8, 2011, U.S. Appl. No. 12/579,600, filed Oct. 15, 2009, Woraya Benjavasukul et al.
Final Office Action dated Jul. 24, 2012, U.S. Appl. No. 13/156,257, filed Jun. 8, 2011, Woraya Benjavasukul et al.

* cited by examiner

US 10,269,686 B1

METHOD OF IMPROVING ADHESION BETWEEN MOLDING COMPOUNDS AND AN APPARATUS THEREOF

CROSS-REFERENCE TO RELATED APPLICATION(S)

This patent application claims priority under 35 U.S.C. § 119(e) of the U.S. Provisional Patent Application Ser. No. 62/167,157, filed May 27, 2015, entitled "SEMICONDUCTOR PACKAGE WITH PLATING METAL SHIELD," which is hereby incorporated by reference in its entirety.

FIELD OF THE INVENTION

The present invention relates to semiconductor packaging. More specifically, the present invention relates to improved adhesion between molding compounds in semiconductor packages.

BACKGROUND OF THE INVENTION

Semiconductor packages with poor adhesion between two molding compounds can lead to reliability issues, including package failure. Thus, there is a need for a semiconductor package with improved adhesion strength on the two molding compounds.

SUMMARY OF THE INVENTION

Embodiments of the present invention relate to a semiconductor package that includes a locking feature. The locking feature is provided by an unnatural surface roughness of a first molding compound to increase adhesion with a second molding compound. Surfaces of first molding compound are roughened by an abrasion process such that the surfaces are rougher than the natural surface roughness of an untreated molding compound surface. The roughened surfaces of the first molding compound provide better adhesion of the second molding compound to the roughened surfaces than to untreated surfaces (e.g., surfaces with the natural surface roughness).

In one aspect, a semiconductor package is provided. The semiconductor device includes a molded leadframe. The molded leadframe includes a partially etched leadframe that is partially encased in a first molding compound. A top surface of the first molding compound has an unnatural surface roughness that is rougher than a natural surface roughness of an untreated molding compound surface. The semiconductor package also includes a die electrically mounted on the molded leadframe, and a second molding compound partially encapsulating the die and the molded leadframe. A bottom surface of the second molding compound conforms to the unnatural surface roughness of the top surface of the first molding compound.

In some embodiments, the unnatural surface roughness of the top surface of the first molding compounds creates a locking feature to a following compound molding process. In some embodiments, the locking feature is created in part by first molding compound fillers.

The first molding compound and the second molding compound are of the same material. Alternatively, the first molding compound and the second molding compound are of different materials. In some embodiments, the different materials have different thermal characteristics.

In some embodiments, the semiconductor package is adjacent to at least one other semiconductor package in an molded array, and the second molding compound extends from one end of the molded array to an opposite end of the molded array. The at least one other semiconductor package in the molded array is similarly configured as the semiconductor package.

In some embodiments, side surfaces of exterior contacts are align with side surfaces of the second molding compound.

In another aspect, a method of manufacturing semiconductor devices is provided. The method includes obtaining a molded leadframe that includes a top side and a bottom side, wherein the molded leadframe includes a partially etched leadframe that is partially encapsulated with a first molding compound, wherein a top surface of the first molding compound has the natural surface roughness of an untreated molding compound surface. The method also includes performing an abrasion procedure to roughen the top surface of the first molding compound such that, after the abrasion procedure, the top surface of the first molding compound has an unnatural surface roughness that is rougher than the natural surface roughness. The method also includes mounting a plurality of dies on the molded leadframe, encapsulating the plurality of dies with a second molding compound to form a molded array, wherein a bottom surface of the second molding compound conforms to the unnatural surface roughness of the top surface of the first molding compound, and singulating the molded array to form discrete semiconductor devices.

In some embodiments, obtaining a molded leadframe includes coupling a tape to a bottom side of the etched leadframe, placing the etched leadframe with the tape in a mold, injecting the first molding compound into the mold such that the first molding compound fills all empty cavities, thereby partially encapsulating the etched leadframe, and removing the etched leadframe that is partially encapsulated with the first molding compound.

In some embodiments, the abrasion procedure includes coating a top surface of the first molding compound with an adhesion promoter material, heating the molded leadframe with the adhesion promoter material such that the adhesion promoter material reacts with a portion of the first molding compound, and etching away a baked film, resulting in the top surface of the first molding compound having the unnatural surface roughness.

In some embodiments, the molded leadframe with the adhesion promoter material is heated to a temperature that allows the adhesion promoter material to react with a first molding compound resin but not with first molding compound fillers, which thereby results in the baked film. The baked film is etched out using a wet chemical permanganic acid.

In some embodiments, the top surface of the first molding compound having the unnatural surface roughness provides anchor points for the second molding compound.

The plurality of dies is mounted to the molded leadframe via wires. Alternatively, the plurality of dies is mounted to the molded leadframe via metallic bumps.

In some embodiments, the method includes, after performing an abrasion procedure and before mounting a plurality of dies, removing the tape.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE INVENTION

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
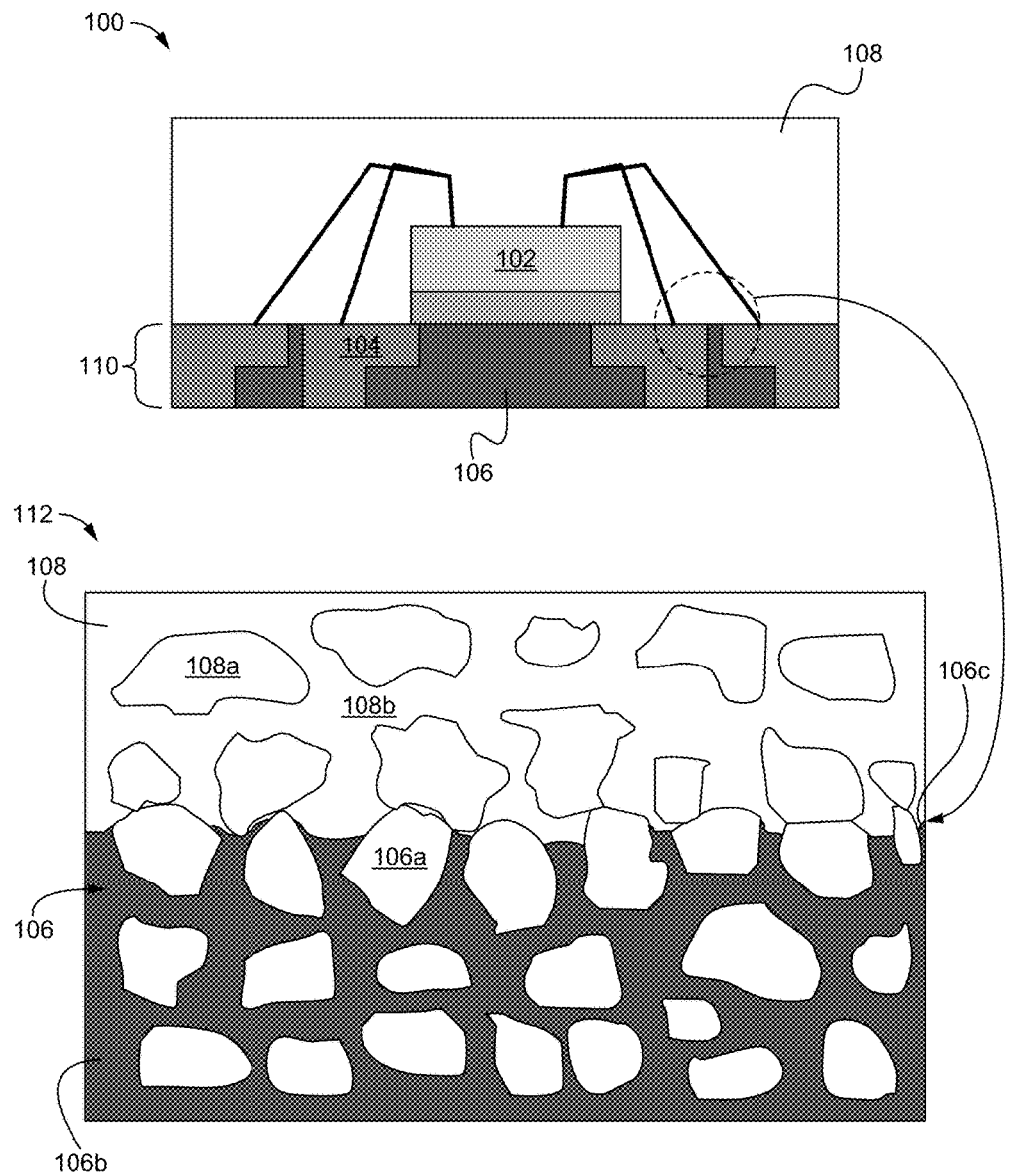
FIG. 1 illustrates a cross-sectional view of an exemplary semiconductor package in accordance with some embodiments of the present invention.

FIG. 1 illustrates a cross-sectional view of an exemplary semiconductor package 100 in accordance with some embodiments of the present invention. The package 100 includes electronic component(s) 102 coupled to a molded leadframe 110 via bond wires or, alternatively or in addition to, metallic bumps. The package 100 also includes a second molding compound 108 encapsulating the electronic component 102 to the molded leadframe 110. The molded leadframe 110 is a partially etched leadframe that includes a plurality of contacts 104 and that is partially molded or encased with a first molding compound 106. In some embodiments, the molded leadframe 110 can also include step cavities (not illustrated) capable of receiving a thicker electronic component or multiple stacked electronic components, larger wires or metallic bumps. For example, a step cavity is configured to receive an electronic component such that the bottom surface of the electronic component is positioned below the top surface of the molded leadframe.

A magnified view 112 shows the adhesion between the two molding compounds 106, 108. Each molding compound 106, 108 includes molding compound fillers 106a, 108a and molding compound resin 106b, 108b. The high magnification view 112 shows the roughness 106c of a top surface of the first molding compound 106 after a surface treatment process that is required to achieve an adhesion with the second molding compound 108 that is better than an adhesion when the first molding compound 106 is untreated. After the surface treatment process, the roughness 106c of the top surface of the first molding compound 106 is rougher than the natural surface roughness of an untreated molding compound surface. In other words, the top surface of the first molding compound 106 has an unnatural surface roughness that is rougher than the natural surface roughness. The strength of the molding compound adhesion is created by the roughness 106a of the top surface of the first molding compound 106 in the molded leadframe strip 110. A bottom surface of the second molding compound 108 conforms to the unnatural surface roughness 106a of the top surface of the first molding compound 106.

Figure 2A:
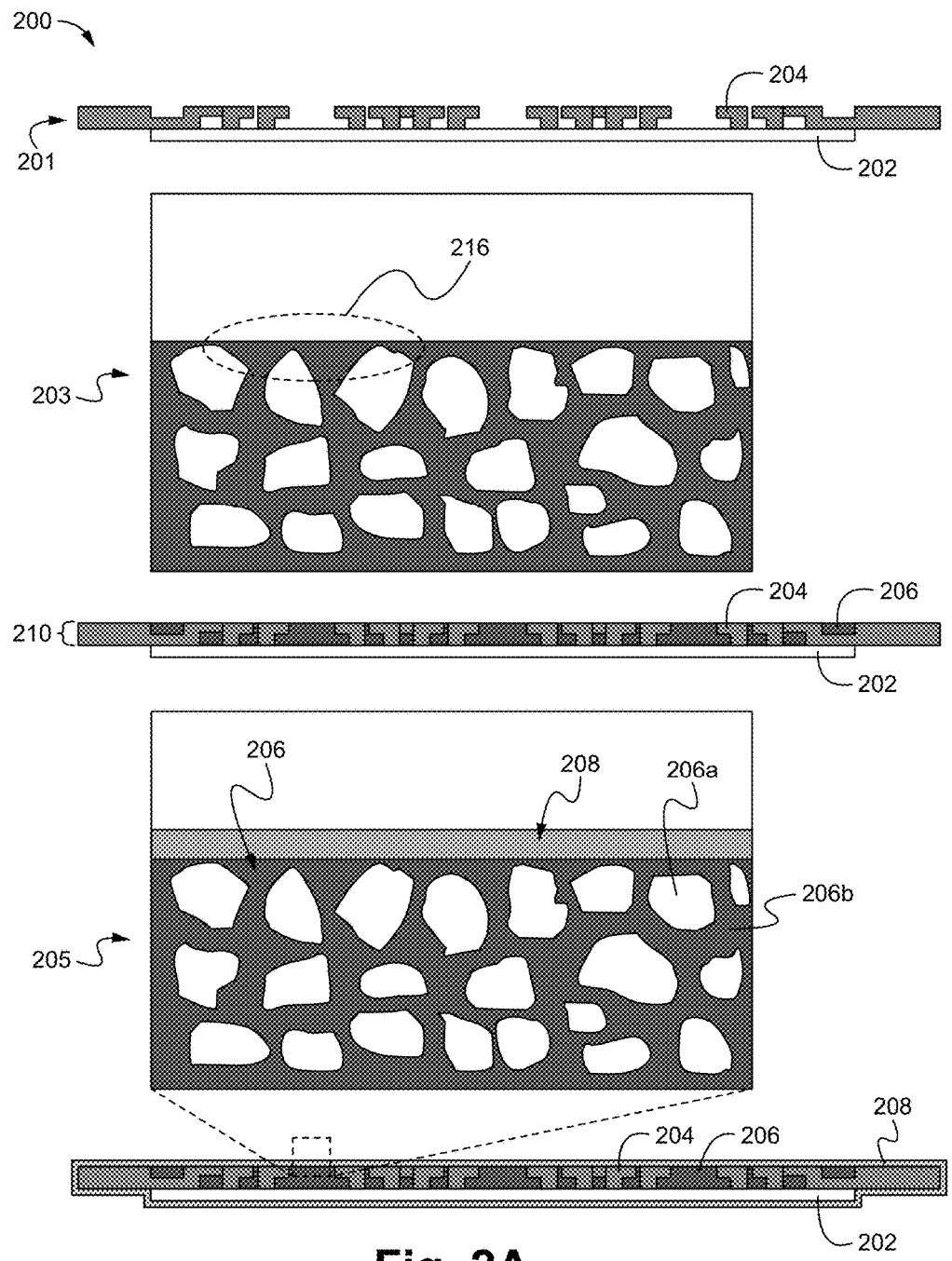
FIGS. 2A-2C illustrate a package forming process of manufacturing the semiconductor device of FIG. 1 in accordance with some embodiments of the present invention.
Figure 2B:
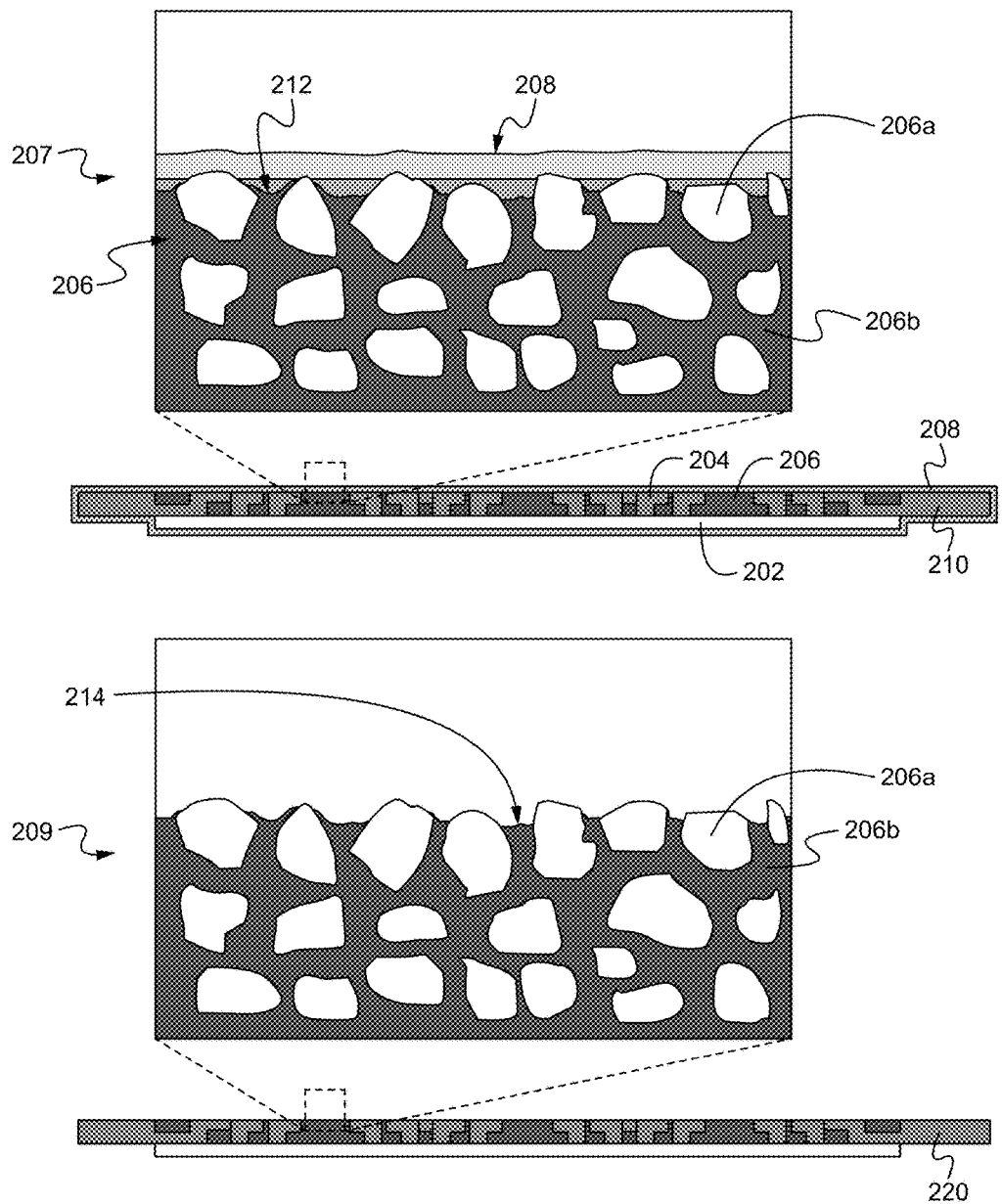
Figure 2C:
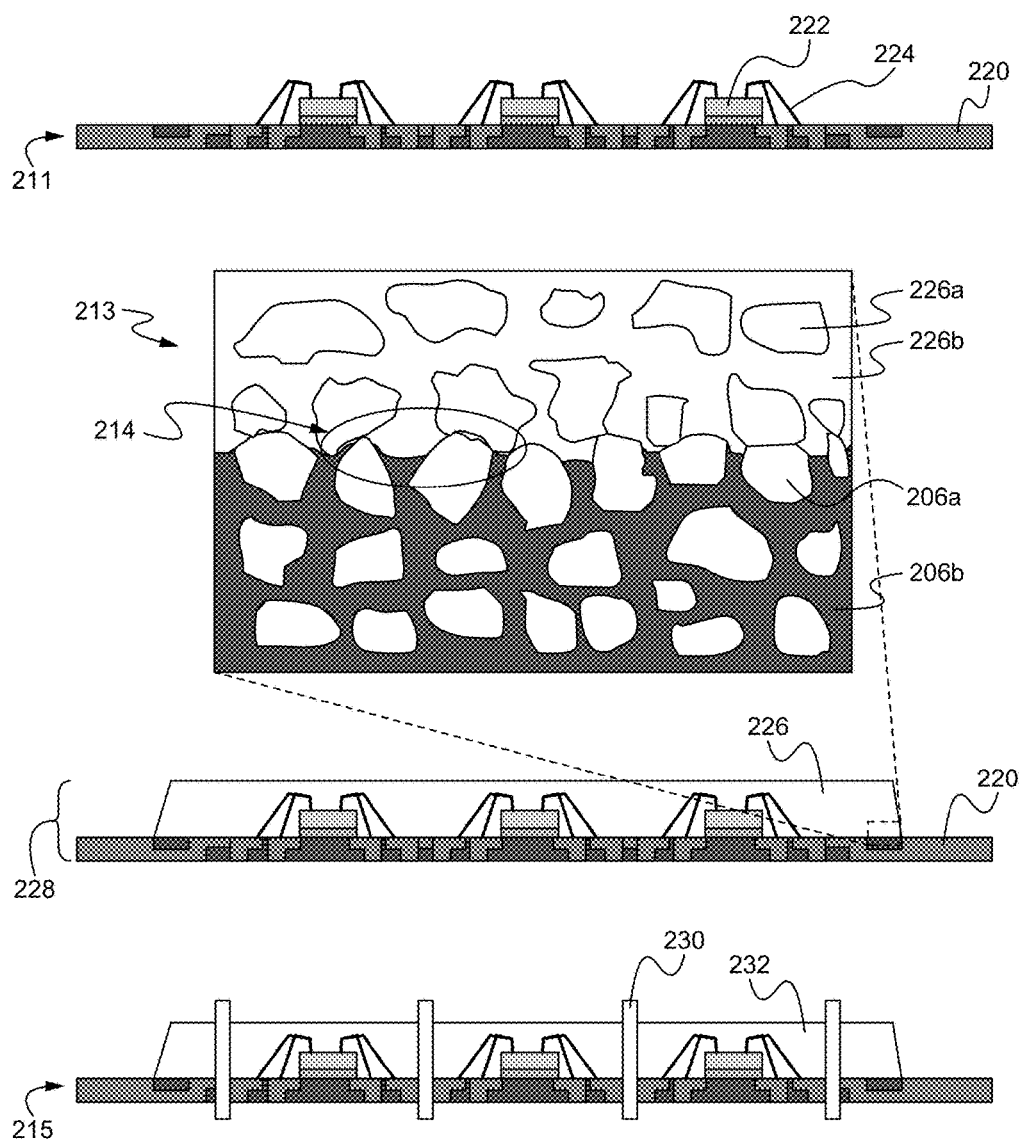

FIGS. 2A-2C illustrate a package forming process 200 of manufacturing the semiconductor device 100 of FIG. 1 in accordance with some embodiments of the present invention. At Step 201, a tape 202 is coupled to a bottom side of a partially etched leadframe. The leadframe is etched using a half-etch technique to form a plurality of contacts 204. In some embodiments, the plurality of contacts 204 can be arranged to includes a first portion as exterior contacts and a second portion as interior contacts. Although not illustrated, the leadframe can also be etched to form a plurality of die attach pads. In some embodiments, the tape 202 is able to withstand a high temperature application. At Step 203, the partially etched leadframe is partially encapsulated with a first molding compound 206 to form a molded leadframe 210. In some embodiments, the partially etched leadframe with the tape 202 is placed inside a mold, which is used to effectuate an injection therein of the first molding compound 206. Once the partially etched leadframe is in place between a top portion and a bottom portion of the mold, the first molding compound 206 is injected and fills all empty cavities. The first molding compound 206 can be a thermoset compound or thermoplastic compound. When removed from the mold, the molded leadframe 210 is formed. Optionally, a de-gate/de-runner step removes excess molding compound. A magnified view is provided of the natural surface roughness 216 of a top surface of the first molding compound 206 before a surface treatment process (abrasion procedure). The molded leadframe 210 includes a top side and a bottom side. The bottom side of the molded leadframe 210 is coupled with the tape 202. Electronic components are to be mounted to the top side of the molded leadframe 210.

To prepare the first molding compound 206 for better adhesion with a second molding compound, the top surface of the first molding compound 206 is roughened so that the top surface has an unnatural surface roughness that is rougher than the natural surface roughness. At Step 205, a coating processes is performed to coat an "adhesion promoter" material 208 on at least the top surface of the first molding compound 206 of the molded leadframe 210. The coating process can be either a spraying or dipping process. The Step 205 shows the result from a dipping process, where a bottom of the tape 202 is coated. In some embodiments, the bottom of the tape 202 is not coated when a spraying process is performed. A magnified view is provided of the layer of adhesion promoter material 208 directly on the top surface of the first molding compound 206.

Continuing with the process 200, at Step 207, the molded leadframe 210 with the adhesion promoter material 208 is heated. In some embodiments, the molded leadframe 210 with the adhesion promoter material 208 is heated to 90° C. to 150° C. for approximately 10 minutes, for example, in an oven. Other temperatures and other heating durations are contemplated. The adhesion promoter material 208 is activated with the heat, thereby reacting with a portion 212 of the first molding compound 206, resulting in a baked film. In particular, the adhesion promoter material 208 reacts with the molding resin 206b in the portion 212 of the first molding compound 206 but not with the compound filler 206a in the portion 212 of the first molding compound 206. In addition, the adhesion promoter material 208 does not react with the metal part of the molded leadframe 210 and with the tape 202.

At Step 209, the baked film is etched away, leaving the top surface of the first molding compound 206 that is rougher 214 than the natural surface roughness 216 of the first molding compound 206 (e.g., before the surface treatment process). Put differently, after the baked film is etched away, the surface of the first molding compound 206 has an unnatural surface roughness. In some embodiments, a wet chemical permanganic acid is used to etch out the baked film, resulting a roughened leadframe 220. The roughness 214 of the top surface of the first molding compound 206, which is created at least by the compound fillers 206a, provides anchor points for a following molding compound. Other abrasion processes are contemplated to roughen the top surface of the first molding compound 206 to obtain an unnatural surface roughness.

Continuing with the process 200, at Step 211, a plurality of dies 222 is coupled with the roughened leadframe 220. Coupling of the plurality of dies 222 with the roughened leadframe 220 can be via wires 224 (as illustrated) or via metallic bumps (not illustrated). In some embodiments, the tape is removed prior to the Step 211. Alternatively, the tape is removed after the Step 211. At Step 213, molding is performed to encapsulate the plurality of dies 222 inside a second molding compound 226, which includes compound fillers 226a and compound resin 226b, to form a molded array 228. Circuitry is inside the second molding compound 226. In some embodiments, the second molding compound 226 and the first molding compound 206 are of the same material. Alternatively, the second molding compound 226 and the first molding compound 206 are able to be different to meet the demands of particular applications. By way of example, different molding compounds have different thermal characteristics such as thermal resistivity and thermal expansion. A magnified view is provided of the adhesion of the molding compounds 206, 226. The roughness 214 of the top surface the first molding compound 206 creates a locking feature for the second molding compound 226. A bottom surface of the second molding compound 226 conforms to the roughness 214 of the top surface the first molding compound 206. The molded array 228 includes a package/top side and an interfacing/bottom side.

At Step 215, a cut through procedure is performed from the top side to the bottom side of the molded array 228 to form individual/discrete semiconductor packages 232. A tool 230, such as a saw, is used to fully cut the molded array 228 to singulate the semiconductor packages 232. Each of the plurality of semiconductor devices 232 is similarly configured at the semiconductor device 100. The singulated semiconductor packages 232 are generally tested, subjected to stress, and tested again to ensure reliability and to filter out non passing or non standard units.

Returning to FIG. 1, the unnatural surface roughness 106a of the top surface of the first molding compound 106 creates the locking feature to a following compound molding process. The first molding compound 106 comprises compound fillers 106a and compound resin 106b. The roughness 106a is created at least by the compound fillers 106a, which provides anchor points for the second molding compound 108. The adhesion between the two molding compounds 106, 108 is stronger than the adhesion when the top surface of first molding compound 106 is untreated (e.g., not roughened).

Although one package type is discussed above in FIGS. 1 and 2, different package types are contemplated and can be formed using the discussed molding compound surface preparation techniques. It should also be understood that even though the discussed molding compound surface preparation pertains to multi-molding compound layers, a surface(s) of a molding compound can also be prepared accordingly for adhesion with a metal layer. An exemplary molding compound to metal layer adhesion is discussed in the co-pending U.S. patent application Ser. No. 15/167,757, entitled "A Semiconductor Package with Plated Metal Shielding and a Method thereof," filed on May 27, 2016, which is hereby incorporated by reference in its entirety.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A semiconductor package comprising:
   a molded leadframe including a partially etched leadframe that is partially encased in a first molding compound, wherein the first molding compound includes first molding compound fillers and first molding compound resin, wherein a top surface of the first molding compound has an unnatural surface roughness that is rougher than a natural surface roughness of an untreated molding compound surface, wherein a portion of the first molding compound fillers that couples with a subsequent molding compound has filler tips that protrude beyond all of the various uppermost surfaces of the first molding compound resin to substantially form the unnatural surface roughness of the first molding compound;
   a die electrically mounted on the molded leadframe; and
   a second molding compound partially encapsulating the die and the molded leadframe, wherein a bottom surface of the second molding compound conforms to the unnatural surface roughness of the top surface of the first molding compound.

2. The semiconductor package of claim 1, wherein the unnatural surface roughness of the top surface of the first molding compounds creates a locking feature to a following compound molding process.

3. The semiconductor package of claim 2, wherein the locking feature is created in part by the first molding compound fillers.

4. The semiconductor package of claim 3, wherein the first molding compound and the second molding compound are of the same material.

5. The semiconductor package of claim 3, wherein the first molding compound and the second molding compound are of different materials.

6. The semiconductor package of claim 5, wherein the different materials have different thermal characteristics.

7. The semiconductor package of claim 3, wherein the semiconductor package is adjacent to at least one other semiconductor package in an molded array, wherein the second molding compound extends from one end of the molded array to an opposite end of the molded array.

8. The semiconductor package of claim 7, wherein the at least one other semiconductor package in the molded array is substantially the same as the semiconductor package.

9. The semiconductor package of claim 1, wherein side surfaces of exterior contacts are align with side surfaces of the second molding compound.

10. The semiconductor package of claim 3, wherein the first molding compound fillers provide anchor points for the second molding compound.

11. The semiconductor package of claim 3, wherein the die is at least partially directly contacting a top portion of the first molding compound of the molded leadframe.

12. The semiconductor package of claim 11, wherein the partially etched leadframe includes a plurality of contacts that is partially encased in the first molding compound.

13. The semiconductor package of claim 12, wherein a first portion of the plurality of contacts includes exterior contacts and a second portion of the plurality of contacts includes interior contacts.

14. The semiconductor package of claim 3, wherein the die is at least partially on the unnatural roughened top surface of the first molding compound of the molded leadframe.

15. A semiconductor package comprising:
  a molded leadframe including a partially etched leadframe that is partially encased in a first molding compound, wherein the first molding compound includes first molding compound fillers and first molding compound resin, wherein a top surface of the first molding compound has an unnatural surface roughness that is rougher than a natural surface roughness of an untreated molding compound surface, wherein a portion of the first molding compound fillers that couples with a subsequent molding compound has filler tips that protrude beyond all of the various uppermost surfaces of the first molding compound resin to substantially form the unnatural surface roughness of the first molding compound;
  a die at least partially mounted on the unnatural roughened top surface of the first molding compound of the molded leadframe; and
  a second molding compound partially encapsulating the die and the molded leadframe, wherein a bottom surface of the second molding compound conforms to the unnatural surface roughness of the top surface of the first molding compound.

16. The semiconductor package of claim 15, wherein the semiconductor package is adjacent to at least one other semiconductor package in an molded array, wherein the second molding compound extends from one end of the molded array to an opposite end of the molded array.

17. The semiconductor package of claim 16, wherein the at least one other semiconductor package in the molded array is substantially the same as the semiconductor package.

18. The semiconductor package of claim 15, wherein the first molding compound fillers are compound fillers that do not to react with an adhesion promoter material.

19. The semiconductor package of claim 18, wherein the first molding compound resin is a resin that reacts with the adhesion promoter.

20. The semiconductor package of claim 18, wherein the first molding compound fillers are dispersed throughout the first molding compound resin, wherein the portion of the first molding compound fillers is a topmost portion of the first molding compound fillers.

* * * * *